(12) United States Patent
Longhini et al.

(10) Patent No.: US 9,097,751 B1
(45) Date of Patent: Aug. 4, 2015

(54) LINEAR VOLTAGE RESPONSE OF NON-UNIFORM ARRAYS OF BI-SQUIDS

(71) Applicants: Patrick Longhini, San Diego, CA (US); Visarath In, Chula Vista, CA (US); Anna Leese de Escobar, Encinitas, CA (US); Antonio Palacios, San Diego, CA (US); Oleg Mukhanov, Putnam Valley, NY (US)

(72) Inventors: Patrick Longhini, San Diego, CA (US); Visarath In, Chula Vista, CA (US); Anna Leese de Escobar, Encinitas, CA (US); Antonio Palacios, San Diego, CA (US); Oleg Mukhanov, Putnam Valley, NY (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 435 days.

(21) Appl. No.: 13/686,994

(22) Filed: Nov. 28, 2012

(51) Int. Cl.
*G01R 33/02* (2006.01)
*G01R 33/035* (2006.01)

(52) U.S. Cl.
CPC .................................. *G01R 33/0356* (2013.01)

(58) Field of Classification Search
CPC ...... G01R 33/58; G01R 33/354; G01R 33/356
See application file for complete search history.

(56) References Cited

U.S. PATENT DOCUMENTS

| | | | | |
|---|---|---|---|---|
| 4,403,189 A | * | 9/1983 | Simmonds | 324/248 |
| 4,879,488 A | * | 11/1989 | Silver | 341/171 |
| 5,004,724 A | * | 4/1991 | De | 505/162 |
| 5,291,135 A | * | 3/1994 | Hotta et al. | 324/248 |
| 5,863,868 A | * | 1/1999 | Chan et al. | 505/162 |
| 5,880,647 A | * | 3/1999 | Kim | 333/99 S |
| 6,448,767 B1 | * | 9/2002 | Ganther et al. | 324/248 |
| 7,369,093 B2 | * | 5/2008 | Oppenlander et al. | 343/772 |
| 7,863,892 B2 | * | 1/2011 | Morley et al. | 324/248 |
| 8,179,133 B1 | * | 5/2012 | Kornev et al. | 324/248 |
| 2005/0030016 A1 | * | 2/2005 | Butters et al. | 324/247 |
| 2005/0206376 A1 | * | 9/2005 | Matthews et al. | 324/248 |
| 2006/0145694 A1 | * | 7/2006 | Oppenlander et al. | 324/248 |
| 2007/0241747 A1 | * | 10/2007 | Morley et al. | 324/248 |
| 2011/0065585 A1 | * | 3/2011 | Lanting et al. | 505/162 |

OTHER PUBLICATIONS

Patrick Longhini et al., Voltage Response of Non-Uniform Arrays of Bi-Superconducting Quantum Interference Devices, J. Appl. Phys. 111, 093920 (2012); doi: 10.1063/1.4712039.

* cited by examiner

*Primary Examiner* — Hoai-An D Nguyen
*Assistant Examiner* — Dominic Hawkins
(74) *Attorney, Agent, or Firm* — SSC Pacific Patent Office; Arthur K. Samora; Kyle Eppele

(57) ABSTRACT

An amplifier and method for improving linear response includes a plurality of N bi-SQUIDs. Each bi-SQUID has a non-uniform bi-SQUID parameter $\beta_i$, described by $\beta_i = 2\pi L_i I_{ci} \Phi_0$ can be defined for each bi-SQUIDs from i=1 to N, where $L_i$ is the loop inductance, $i_c$ is the critical current, and $\Phi_0$ is a flux quantum for each bi-SQUID. The non-uniform bi-SQUIDs can be connected in series or in parallel to establish a Superconducting Quantum Interference Filter (SQIF) array of bi-SQUIDs. Once connected, a mutual inductance between the connected bi-SQUIDs can be established. If the mutual inductance between connected bi-SQUIDs is accounted for, careful manipulation of the critical current or the loop size, or both, of each bi-SQUID can result in extremely uniform behavior (linear response) of the SQIF when considered as a whole, even though the behavior of the element bi-SQUIDs is non-uniform (different $\beta_i$, parameters).

10 Claims, 8 Drawing Sheets

LINEAR VOLTAGE RESPONSE OF NON-UNIFORM ARRAYS OF BI-SQUIDS

FEDERALLY-SPONSORED RESEARCH AND DEVELOPMENT

This invention (Navy Case No. 101302) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619)553-5118; email ssc pac T2@navy.mil.

FIELD OF THE INVENTION

The present invention pertains generally to mechanisms and methods for improving signal detection and amplification. More specifically, the present invention pertains to Superconducting Quantum Interference Filters (SQIFs). The invention is particularly, but not exclusively, useful as a mechanism and methods for incorporating multiple Superconductive Quantum Interference Devices (SQUIDs) having Josephson Junctions (JJs) with non-uniform area distributions into SQIFs in a manner that results in a high linear voltage response over a wide dynamic range.

BACKGROUND OF THE INVENTION

The SQUID is one of the most sensitive magnetic field devices in the prior art, and it can be used for wide range of applications, including biology, medicine, geology, systems for semiconductor circuit diagnostics, security MRI and even cosmology research. In recent years, arrays of coupled oscillators have been considered as a general mechanism for improving signal detection and amplification. Theoretical and experimental studies can be interpreted to show that arrays of SQUIDs can yield comparable improvements in signal output relative to background noise, over those of a single SQUID device.

A peculiar configuration that has gained considerable attention among the physics and engineering community is that of multi-loop arrays of JJs with non-uniformly distributed loop areas. Typically, each loop contains two JJs, i.e., a standard DC-SQUID, but their size vary from loop to loop. These types of unconventional geometric structures of JJs are known to exhibit a magnetic flux dependent voltage response $V(\phi_e)$, where $\phi_e$ denotes an external magnetic flux normalized by the quantum flux, that has a pronounced single peak with a large voltage swing at zero magnetic field. The potential high dynamic range and linearity of the "anti-peak" voltage response render the array an ideal detector of absolute strength of external magnetic fields. These arrays are also commonly known as Superconducting Quantum Interference Filters (SQIFs).

Improving the linearity of SQIFs is critical for developing advanced technologies, including: low noise amplifier (LNA) that can increase link margins and affect an entire communication system. SQIFs can also be used in unmanned aerial vehicles (UAVs), where size, weight and power are limited, and "electrically small" antennas that can provide acceptable gain are needed. SQIFs can also be used in land mine detection applications. But for these applications, it is desired to improve the linear response of the SQIF device.

A standard approach to improve linearity and dynamic range of a SQIF device can be to employ electronic feedback, but this approach can unfortunately limits the frequency response of the system. So, for applications that require a large signal frequency response, feedback can not be used. Series arrays of identical DC-SQUIDs have also been studied as an alternative approach to produce an anti-peak voltage response, but the linearity appears to be inferior to that of non-uniform loops.

In view of the above, it is an object of the present invention to provide a SQIF that can incorporate individual array cells of bi-SQUIDS, which can contain three JJs, as opposed to the standard practice of two JJs per loop. Another object of the present invention if to provide a SQIF amplifier with improved linear repsonse when compared to SQIF that are comprised of arrays of conventional DC-SQUIDs (SQUIDs with two JJs). Still another object of the present invention is to provide a novel linearization method for maximizing the voltage response and dynamic range of a SQIF by manipulating the critical current, inductive coupling between loops, number of loops, bias current, and distribution of loop areas of the array cell bi-SQUIDs. Yet another object of the present invention is to provide a SQIF array where bi-SQUIDs can be integrated into a two-dimensional structure in both serial and parallel configurations to deliver superior linearity at appropriate impedance. Another object of the present invention is to provide a SQIF and methods for manufacture that can be easily tailored in a cost-effective manner to result in a SQIF having bi-SQUID array cells that has been optimized according to the user's needs.

SUMMARY OF THE INVENTION

A method for improving linearity over a wide dynamic range for an amplifier can include the initial step of providing a plurality of N individual array cells. Each of the N array cells can have 3 Josephson Junctions to establish a bi-SQUID for the array cell. Each Josephson Junction can have a critical current $i_c$, and loop inductance $L_i$. A non-uniform bi-SQUID parameter $\beta_i$, described by $\beta_i = 2\pi L_i I_{ci}/\Phi_0$ can be defined for each bi-SQUIDs from i=1 to N, where $L_i$ is the loop inductance, $i_c$ is said critical current, and $\Phi_0$ is a flux quantum for each said bi-SQUID.

The non-uniform bi-SQUIDs can be connected in series or in parallel to establish a Superconducting Quantum Interference Filter (SQIF) array of said bi-SQUIDs. Once connected a mutual inductance between the connected bi-SQUIDs can be established. If the mutual inductance between connected bi-SQUIDs is accounted for, careful manipulation of the critical current or the loop size, or both, of each bi-SQUID, can result in extremely uniform behavior (linear response) of the SQIF when considered as a whole, even though the behavior of the element bi-SQUIDs is non-uniform (different $\beta_i$, parameters). The manner in which the mutual inductance is accounted for depends on the type of distribution of bi-SQUID parameters $\beta_i$, as well as whether the bi-SQUIDs are connected in series or in parallel.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

A. Prior Art

1. The DC-SQUID

Figure 1:
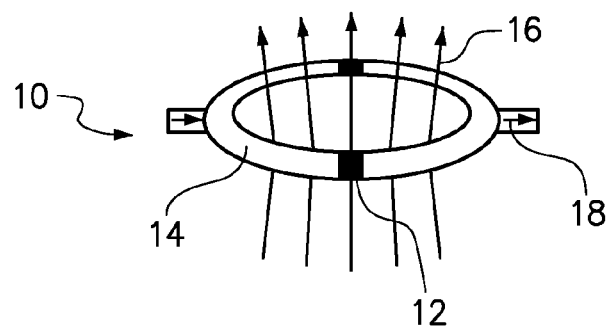
FIG. 1 is a schematic diagram of a direct current Superconductive Quantum Interference Devices (DC-SQUID)

Referring initially to FIG. 1, a conventional direct current DC-SQUID 10 of the prior art is shown. DC-SQUID 10 can consist of two Josephson Junctions (JJ's) 12 that can be employed in a loop 14 of superconducting material. DC-SQUID 10 can further include a magnetic field, as indicated by arrows 16 in FIG. 1 and a biasing current 18. DC-SQUIDs can exhibit noise-floors as low as 1-30 femto-tesla/√Hz.

Figure 2:
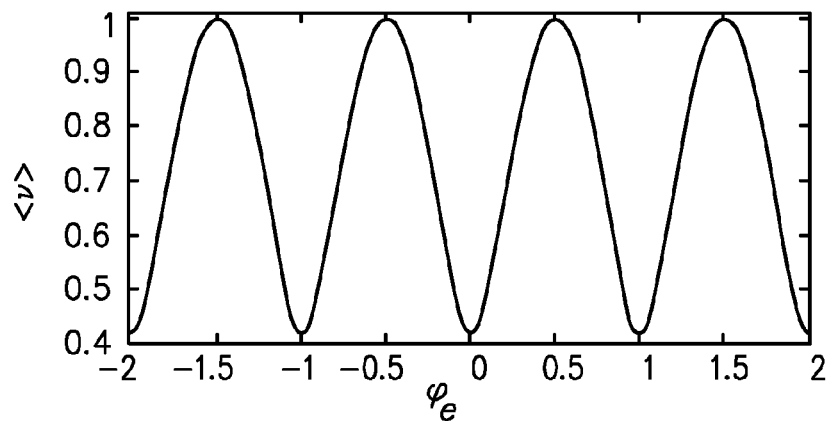
FIG. 2 is a graphical representation of the voltage response of DC-SQUID as a function of magnetic field strength.

As shown in FIG. 2, the interference of the superconducting quantum state of the DC-SQUID is sensitive to the strength of the magnetic field 16. FIG. 2 shows the time-averaged voltage response <v> between the two junctions that is normalized to the characteristic voltage of the JJ's of a DC-SQUID magnetometer that is illustrated in FIG. 1. As shown, the time-averaged voltage response between the two junctions is plotted as a function of the normalized external magnetic flux $\phi_e$.

DC-SQUIDs can form the "elemental unit" of a coupled array of SQUID's, and a array of when considered together can form a Superconducting Quantum Interference Filter, or SQIF, according to several embodiments of the present invention. But before coupling SQUIDs to form a SQIF is disclosed, a brief overview of the magnetic dynamics of a single DC-SQUID may be helpful. Conventionally, the voltage measured across the JJs can be taken as the SQUID "output." However, it can also convenient to take the circulating current $I_s$ (experimentally measured via the associated "shielding flux") as the output variable of interest. In the presence of an external magnetic flux $\Phi_e$, one obtains a loop flux consisting of the (geometrical) component $\Phi_e$ together with a contribution arising from the induced circulating or shielding current $I_s$ that tends to screen the applied flux:

$$\Phi = \Phi_e + LI_s, \qquad (1)$$

with L being the loop inductance fo the DC-SQUID loop 14. The Josephson currents in each arm of the "interferometer" are $I_c \sin \phi_1$ and $I_c \sin \phi_2$, with the junctions assumed to be identical with critical currents $I_c$, and with $\phi_1$ and $\phi_2$ being the quantum phase difference across the Josephson junctions. The wave-function must remain single-valued around the SQUID loop, leading to the phase continuity condition $$\phi_2 - \phi_1 = 2\pi n - 2\pi \Phi/\Phi_0, \qquad (2)$$

n being an integer, and $\Phi_0 = h/2e$ the flux quantum. Combining (1) and (2) and setting n=0, we find for the circulating current $I_s$:

$$\beta \frac{I_s}{I_c} = \varphi_1 - \varphi_2 - 2\pi \frac{\Phi_e}{\Phi_0}, \qquad (3)$$

where $\beta \equiv 2\pi LI_c/\Phi_0$ is the nonlinearity parameter. In the absence of external magnetic flux signals the resistive shunt junction (RSJ) Josephson model can be used to model equations for the currents in the two arms of the DC-SQUID loop 14 via a lumped circuit representation; expressed via the Josephson relations $\dot{\phi}_n = 2eV_n/\hbar$ linking the voltage and the quantum phase difference across the $n^{th}$ junction for n=1,2. These equations can take the form $$\dot{\varphi}_1 = \frac{I_b}{2} - \frac{I_c}{\beta}(\varphi_1 - \varphi_2 - 2\pi\varphi_e) - I_c \sin\varphi_1, \qquad (4)$$

$$\dot{\varphi}_2 = \frac{I_b}{2} + \frac{I_c}{\beta}(\varphi_1 - \varphi_2 - 2\pi\varphi_e) - I_c \sin\varphi_2.$$

where $$\varphi_e = \frac{\Phi_e}{\Phi_0}.$$

Notice that the DC-bias current $I_b$ is applied symmetrically to the loop. In experiments, the bias current and applied flux can be externally controlled. This can permit the user to manipulate the shape of the potential energy function in the two independent variables $\phi_1$ and $\phi_2$ that characterize the input-output transfer characteristic that governs its response.

2. The bi-SQUID

Figure 3:
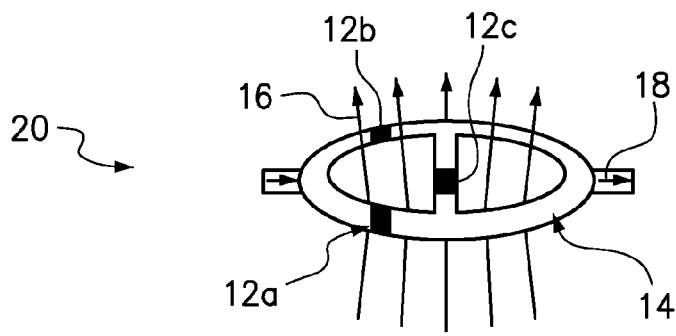
FIG. 3 is a schematic diagram of a bi-SQUID.

The bi-SQUID (bi-SQUID) can be a modified version of a conventional DC-SQUID device but with the ability to produce a more linear voltage response. Referring now to FIG. 3, a diagram of the bi-SQUID 20 is shown. As shown in FIG. 3, bi-SQUID 20 can include the addition of a nonlinear inductance, in the form of a third JJ 12*c*. This third JJ 12*c*, when combined with the main inductance in the loop 14, can acts as a single-junction SQUID, thus leading to a combined bi-SQUID system.

Figure 4:
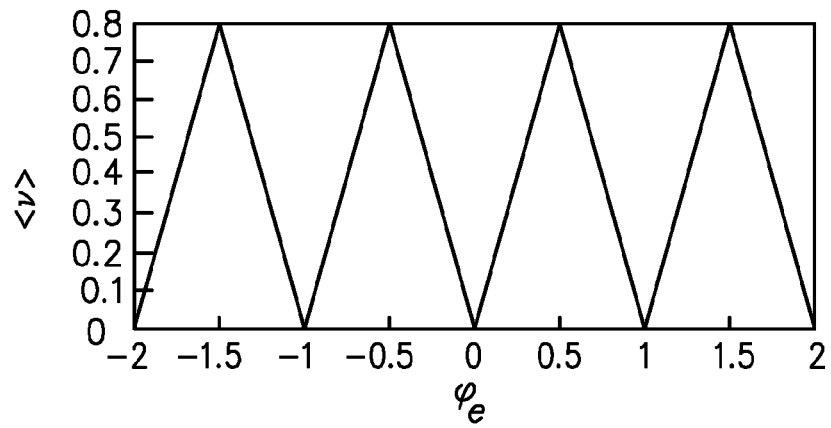
FIG. 4 is a graphical representation of the voltage response of bi-SQUID as a function of magnetic field strength.

FIG. 4 is a time-averaged voltage response between the two junctions, as a function of the normalized external magnetic flux $\phi_e$ for the bi-SQUID 20 of FIG. 3. By comparing FIG. 4 to FIG. 2 for a DC-SQUID, it can be seen that the nonlinear inductance of a bi-SQUID can lead to significant improvements in the linearity of the $V(\phi_e)$ curve. The non-linear inductance can be manipulated through the critical current $I_c$ of the JJs, and particulary the critcial current $I_{c3}$ through the third JJ 12c that is shown in FIG. 3.

Figure 5:
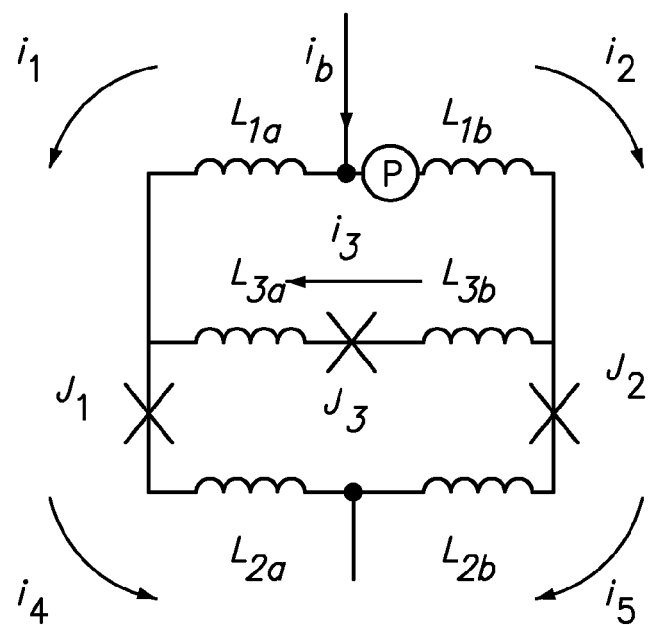
FIG. 5 is an electrical schematic diagram of the bi-SQUID.

FIG. 5 illustrates a circuit schematic that is representative of a bi-SQUID device 20, in which the individual inductances, $L_{ja}$ and $L_{jb}$, where j=1,2,3, were added to model as closely as possible the actual fabricated bi-SQUID thin-film structure. Phase source P in FIG. 5 can acount for a phase shift due of the external magnetic flux $\phi_e$. For JJs 12 that are identical junctions, direct calculations can lead to the following governing equations for the phase dynamics, as called out in equation (5):

$$(L_1+L_{2a})\dot{\phi}_1 - L_{2b}\dot{\phi}_2 - L_1\dot{\phi}_3 = L_{1b}i_b + \phi_2 - \phi_1 + 2\pi\phi_e a_n + L_1 i_{c3} \sin\phi_3 + L_{2b}\sin\phi_2 - (L_1+L_{2a})\sin\phi_1$$

$$L_{2a}\dot{\phi}_1 - (L_1+L_{2b})\dot{\phi}_2 - L_1\dot{\phi}_3 = -L_{1a}i_b + \phi_2 - \phi_1 + 2\pi\phi_e a_n + L_1 i_{c3} \sin\phi_3 - L_{2a}\sin\phi_1 + (L_1+L_{2b})\sin\phi_2$$

$$L_{2a}\dot{\phi}_1 - L_{2b}\dot{\phi}_2 - (L_{3a}+L_{3b})\dot{\phi}_3 = \phi_2 - \phi_3 + \phi_1 - (L_{3a}+L_{3b})i_{c3}\sin\phi_3 - L_{2a}\sin\phi_1 + L_{2b}\sin\phi_2, \quad (5)$$

where $\phi_i$ are the phases on each of the junctions $J_n$, n=1,2,3, $L_1=(L_{1a}+L_{1b})$, $i_{c3}=I_{c3}/I_c$, is the normalized critical current across the third junction $J_3$, $I_{c1}=I_{c2}=I_c$, $a_n$ is a nonlinearity parameter related to the loop size between $J_1$ and $J_2$, and ( ) denotes differentiation with respect to the normalized time $\tau=\omega_c t$, $\omega_c=2\pi V_c/\Phi_0$, $V_c=I_c R_N$.

Figure 6:
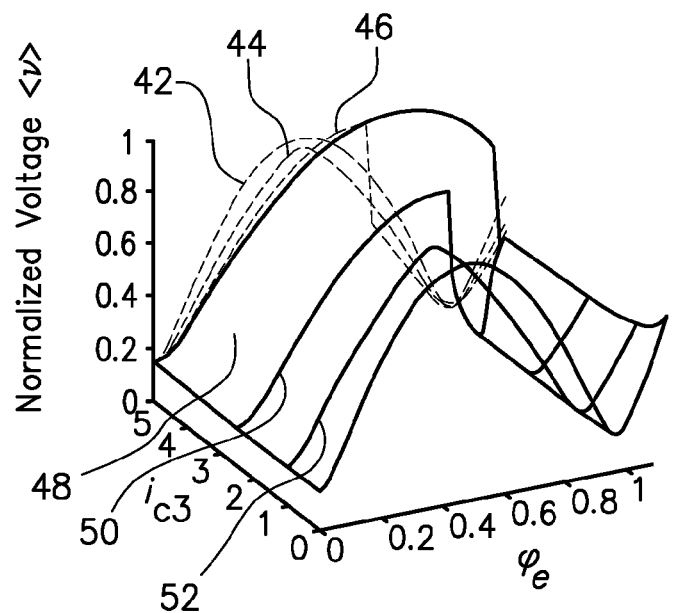
FIG. 6 is a graphical representation of the voltage response of the bi-SQUID of FIG. 3 as a function of magnetic field strength and critical current.

FIG. 6 illustrates the average voltage response of a bi-SQUID device obtained numerically by integrating Eq. (5) and then calculating the voltage response <v> through $$\langle v \rangle = \frac{1}{T}\int_0^T \left(\frac{\dot{\phi}_1 + \dot{\phi}_2}{2}\right) \quad (6)$$

with the following parameters: $i_b=2$, $a_n=1$, $L_{1a}=L_{1b}=0.27$, $L_{2a}=L_{2b}=0.24$, $L_{3a}=L_{3b}=0.3$. FIG. 6 illustrates that the voltage response of the bi-SQUID 20 is significantly more linear than the voltage response of the conventional DC-SQUID 10, which is illustrated in FIG. 4. In FIG. 6, the effects of changing the nonlinear inductance on the linearity of the average voltage response curve $V(\phi_e)$ can be illustrated. Parameter values are the same as in FIG. 4 except that now the critical current $i_{c3}$ can be varied. The dashed lines in FIG. 6 (curves 42, 44 and 46) are the projections of the individual voltage response curves (solid surfaces 48, 50 and 52) for the particular values of $i_{c3}=0$, 1 and 2.5. Curves 42, 44, and 46 in FIG. 6 correspond to values of critical current $i_{c3}$ when parameters, $i_b=2$, $a_n=1$, $L_{1a}=L_{1b}=0.27$, $L_{2a}=L_{2b}=0.24$, and $L_{3a}=L_{3b}=0.3$ for the electrical schematic in FIG. 5 were held constant.

From FIG. 6, it can be seen that at small magnitudes of the critical current $i_{c3}$, the shape of the voltage response curve for a bi-SQUID closely resembles that of a conventional DC-SQUID that is shown in FIG. 4. However, as the parameter $i_{c3}$ increases, the transfer function linearity increases while the voltage response approaches a triangular shape. For larger values of the $i_{c3}>1.0$ parameter, the voltage response curve develops a cusp which results in a hysteresis loop and a decrease in linearity. Thus, there appears to be an optimal value of the critical current $i_{c3}$, located at intermediate magnitudes, where a bi-SQUID 20 can generate the most linear voltage response.

Another way to quantify voltage response of bi-SQUID 20 is through Spurious-Free Dynamic Range (SFDR), which is the usable dynamic range before spurious noise interferes or distorts a fundamental signal. The SFDR is important because it is a widely accepted measurement of fidelity, since the highest spur is often at the second or third harmonic of the signal and is the result of nonlinearity. Thus, to obtain high SFDR output in a SQIF the linearity of the anti-peak response must be improved.

Figure 7:
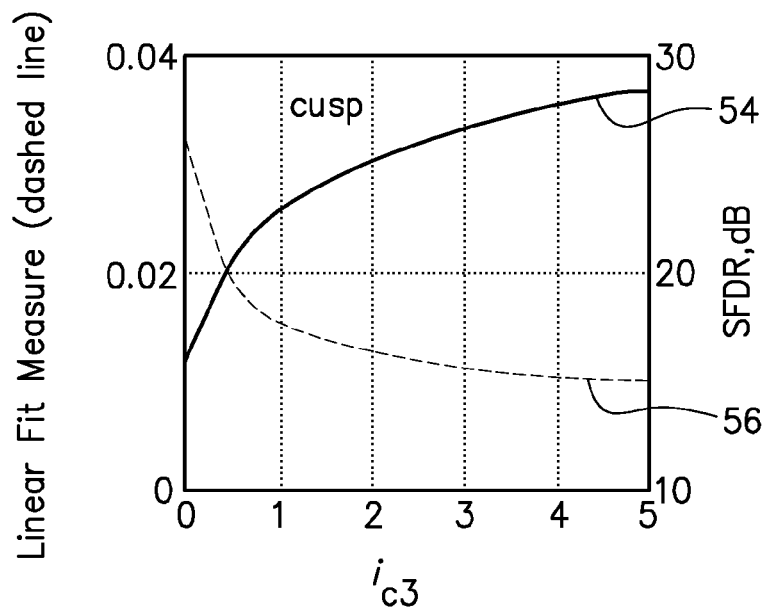
FIG. 7 is a graphical representation of the Spurious Free Dynamic Range (SFDR) voltage response of the bi-SQUID of FIG. 3 as a function of critical current.

To find an optimal value for critical current $i_{c3}$ using SFDR, the linearity of the voltage response can be computed in several embodiments by biasing a single tone sinusoidal flux input at $\Phi_0/4$ with amplitude A, were $A/A_{max}=0.3$ given that $A_{max}$ corresponds to the flux amplitude $\Phi_0/4$ and then measuring the total harmonic distortion. Another approach for computing linearity can be to calculate the slope of the voltage response and then fit a line using the nonlinear least squares method. The linear fit measure in several embodiments of the present invention can be computed by using the error from the linear fit and then dividing by the square of the slope of $V(\phi_e)$ at the individual working point for each individual value of $i_{c3}$. Again we bias the sinusoidal flux input at $\Phi_0/4$ with an amplitude of $A/A_{max}=0.3$. This result approach can result in the graph shown in FIG. 7. FIG. 7 is a graph of linearity test via linear fitting error and SFDR as a function of critical current $i_{c3}$ through JJ 12c. In FIG. 7, it can be observed that best linear response is directly correlated with highest SFDR. There is also development of cusp for $i_{c3}>1$.

Note that the fitting of the line 54 in FIG. 7 can correspond to the same amplitude as used in the SFDR. In FIG. 7, there is no loss in linearity because the branch of the hysteresis loop during the calculation of the fit error and SFDR is never exceeded. The linear fit measure can then be used as a test for linearity, i.e., small values would be indicative of high linearity. Likewise, large SFDR would indicate high linearity. The linear fitting error indicated by dotted line 56 in FIG. 7, can follow the visual description of the linearity of the voltage curves given above. That is, the error decreases steadily as the critical current $i_{c3}$ increases starting with small magnitudes and it then increases for larger magnitudes of this parameter. The optimal value of the critical current, for the particular choice of inductances, was found to be in the vicinity of $i_{c3}=5.0$. Other choices of inductance values can yield similar results.

FIG. 7 also shows the variations in SFDR as function of the critical current $i_{c3}$. As described above, the SFDR can be calculated by biasing at $\Phi_0/4$ and then applying an AC signal at frequency $f_1$, which is much lower than the Josephson frequency. The average voltage response of the summed signal can then be used to compute the Power Spectral Density (PSD) and record the size of the two highest peaks $p_1$ and $p_2$, where $p_1>p_2$, that appear in the PSD spectrum. The largest peak $p_1$ corresponds to the frequency of the applied signal $f_1$ while the second peak $p_2$ is associated with the first harmonic $2f_1$. The ratio in power between the two peaks measures the SFDR. The SFDR curve 54 in FIG. 7 has just the opposite trend as that of the linear fitting error (line 56). In other words, the SFDR curve is directly commensurate to high response linearity, so that SFDR can increase when the linearity increases and vice-versa. SFDR can reach its maximum value exactly at the same value of the critical current $i_{c3}$ where the linear fitting error is minimum.

Experiments with non-uniform multi-loop serial arrays of conventional SQUIDs have shown that the voltage swing of the response curve $V(\phi_e)$ increases proportionally to the number of SQUIDs in the array. This critical observation should extend in a natural way to arrays of bi-SQUIDs with the potential for increasing SFDR and linearity beyond the values shown in FIG. 4. Stated differently, non-uniform SQUIDs can be connected to establish a SQIF according to the present invention, which yields a very linear response over a wide dynamic range.

B. Series bi-SQUID SQIF

Figure 8:
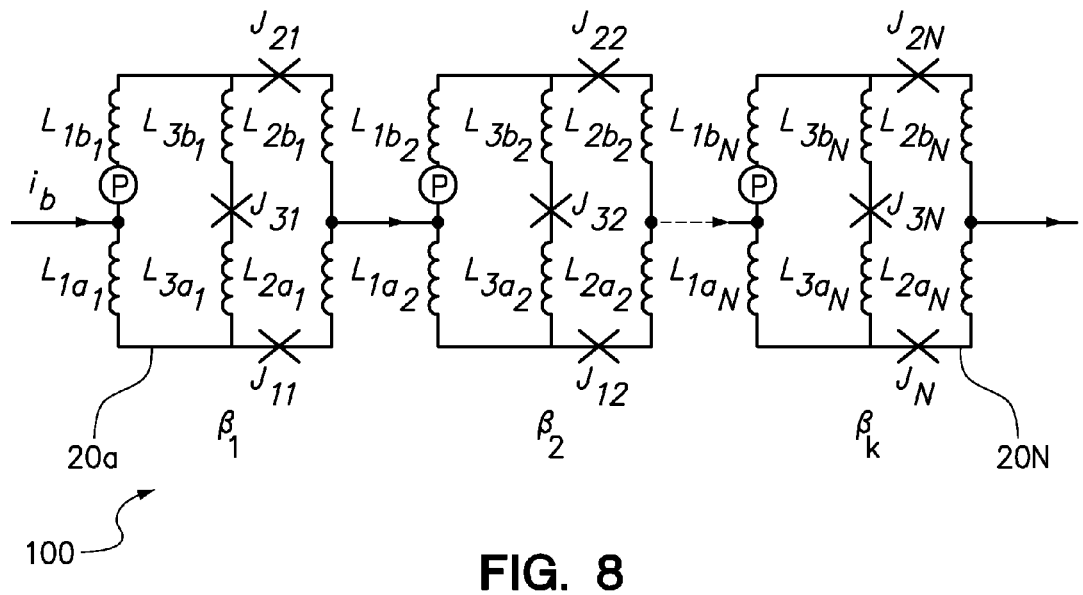
FIG. 8 is a graphical representation of the series SQIF of the present invention according to several embodiments.

FIG. 8 is a circuit representation of an SQIF 100 having a plurality of bi-SQUID devices 20a-20n that can be connected in series, according to several embodiments of the present invention. Generically, a serial array of N SQUIDs can yield a significantly higher output power than a single SQUID. In particular, dynamic range is known to increase as $N^{1/2}$ in the presence of thermal noise. Furthermore, a serial bi-SQUID array (serial SQIF 100) can be designed to produce a voltage output with a unique "anti-peak" at the zero applied magnetic flux. Thus, serial array SQIFs 100 of bi-SQUIDs 20 can be implemented to produce a voltage anti-peak response with increased dynamic range and improved voltage linearity.

The phase dynamics of the serial array shown in FIG. 8 can be described by the following system of differential equations:

$$(L_{1,i}+L_{2a,i})\dot{\phi}_{i,1}-L_{2b,i}\dot{\phi}_{i,2}-L_{1,i}\dot{\phi}_{i,3}=L_{1b,i}i_b+\phi_{i,2}-\phi_{i,1}+$$
$$2\pi\phi_e a_{n,i}+M\Phi_i+L_{1,i}i_{c3,i}\sin\phi_{i,3}+L_{2b,i}\sin\phi_{i,2}-(L_{1,i}+L_{2a,i})\sin\phi_{i,1}$$

$$L_{2a,i}\dot{\phi}_{i,1}-(L_{1,i}+L_{2b,i})\dot{\phi}_{i,2}-L_{1,i}\dot{\phi}_{i,3}=-L_{1a,i}i_b+\phi_{i,2}-\phi_{i,1}+$$
$$2\pi\phi_e a_{n,i}+M\Phi_i+L_{1,i}i_{c3,i}\sin\phi_{i,3}-L_{2a,i}\sin\phi_{i,1}$$

$$L_{2a,i}\dot{\phi}_{i,1}-L_{2b,i}\dot{\phi}_{i,2}-(L_{3a,i}+L_{3b,i})\dot{\phi}_{i,3}=\phi_{i,2}-\phi_{i,3}+\phi_{i,1}+$$
$$M\Phi_i-(L_{3a,i}+L_{3b,i})i_{c3,i}\sin\phi_{i,3}-L_{2a,i}\sin\phi_{i,1}+L_{2b,i}\sin\phi_{i,2},\quad (7)$$

where $\phi_{i,j}$ are the phases on each of the junctions $J_{i,j}$, $i=1\ldots N$, $j=1,2,3$, $L_{1,i}=(L_{1a,i}+L_{1b,i})$, $a_{n,i}$ is a parameter related to the loop size between $J_{i,1}$ and $J_{i,2}$, and M is the coupling strength for the phase interaction $\Phi_i$ between adjacent bi-SQUIDS 20 (one adjacent bi-SQUID 20 for the edge bi-SQUIDS 20a and 20N, and two neighboring bi-SQUIDs 20 for the inner bi-SQUIDS 20b-20N-1) according to:

$$\Phi_i = \begin{cases} \frac{1}{a_{n,2}}(\varphi_{2,1}-\varphi_{2,2}-2\pi\varphi_e a_{n,2}), & \text{for } i=1 \\ \frac{1}{a_{n,i+1}}(\varphi_{i+1,1}-\varphi_{i+1,2}-2\pi\varphi_e a_{n,i+1})+ \\ \frac{1}{a_{n,i-1}}(\varphi_{i-1,1}-\varphi_{i-1,2}-2\pi\varphi_e a_{n,i-1}), & \text{for } i=2,\ldots,N-1 \\ \frac{1}{a_{n,N-1}}(\varphi_{N-1,1}-\varphi_{N-1,2}-2\pi\varphi_e a_{n,N-1}), & \text{for } i=N \end{cases} \quad (8)$$

where $i_b$ is the bias current, $i_{c3}=I_{c3}/I_c$ is the normalized critical current of the third junction $J_3$ in each bi-SQUID 20, $a_{n,i}$ is the nonlinearity parameter related to the bi-SQUID loop. In Eq. 8, inductances $L_{ij}$, $i=1$ to n, $j=1$ to 3 can be assumed to be identical throughout the array. It should be appreciated however, that a set of non-transitory instructions to accomplish the methods of the present invention (computer code) can be written, and those instruction can be input into a processor (not shown). The computer code that can be written to simulate the voltage response of the array can easily handle the case of non-identical inductances $L_{ij}$ within a unit bi-SQUID 20.

The main difference in voltage response from the single bi-SQUID 20 shown in FIG. 5 and the bi-SQUIDs 20 in serial SQIF 100 are because of the mutual inductances between bi-SQUIDS 20a-20n. For the chain configuration of SQIF 100 shown in FIG. 8, the end loops (bi-SQUIDs 20a and 20n) are coupled only to their adjacent neighbors while the inner elements (bi-SQUIDs 20b through 20n-1) are connected to their nearest neighbors, one to the left and one to the right. Thus, and as cited above, the phase dynamics for the $i^{th}$ bi-SQUID loops leads to Eqs. (7).

Numerical simulations of Eq. (7) were can be carried out by the non-transitory written instructions to explore, computationally, the voltage response of the serial array for SQIF 100 as a function of the external field $\phi_e$ and the critical current $i_{c3}$. Different distributions of loop sizes can be investigated for each array, including: linear, Gaussian, exponential, logarithmic, and equal size. For these types of distributions, the Gaussian distribution in a serial array can often produce the highest linear response around the anti-peak. Note that other distributions excluding the (equal loop size distribution) were very similar to the Gaussian. For purpose of this disclosure being described, the distribution of loop sizes chosen can be a Gaussian distribution. It should be appreciated however, that other distributions can be used without departing from the scope of the present invention.

Figure 9:
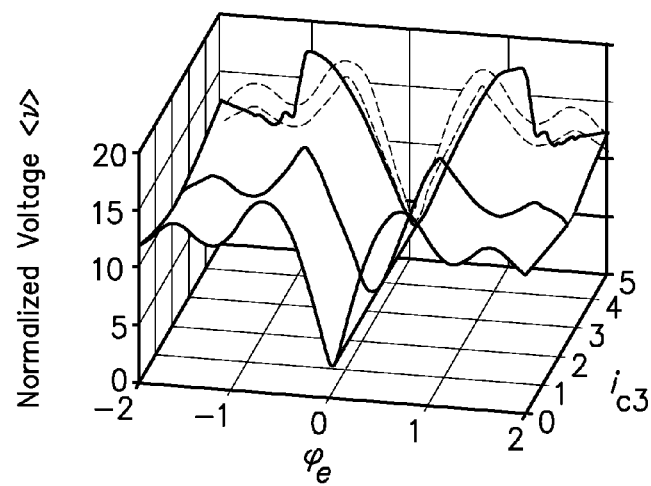
FIG. 9 is a graphical representation of the voltage response of the SQIF of FIG. 8 as a function of magnetic field strength and critical current.

FIG. 9 shows the results of the simulations for a specific array with N=20 bi-SQUID loops with loop sizes that can be selected to vary according to a Gaussian distribution. In FIG. 9, numerical simulations of the voltage response of a non-uniform serial bi-SQUID array (N=20) can be shown as a function of the critical current $i_{c_c}$ and external flux $\phi_e$. Loop sizes are selected according to a Gaussian distribution. $L_{1a}=L_{1b}=0.27$, $L_{2a}=L_{2b}=0.24$, $L_{3a}=L_{3b}=0.3$, M=0.005. As shown in FIG. 9, the voltage output forms an anti-peak at $\phi_e=0$ magnetic flux and, more importantly, the linearity around the anti-peak appears to be changing as $i_{c3}$ changes. For small magnitudes of $i_{c3}$, the voltage response curve appears to mimic that of a conventional SQIF device made up of two-junctions per loop. But as the parameter increases the linearity of the anti-peak appears to increase and starts to resemble, near zero flux, the triangular shape of the voltage output of a single bi-SQUID. This numerical exploration depicted by FIG. 9 suggests that careful adjustment of the critical current parameter $i_{c3}$ can lead to significant improvements of linearity, according to the needs fo the user.

Figure 10:
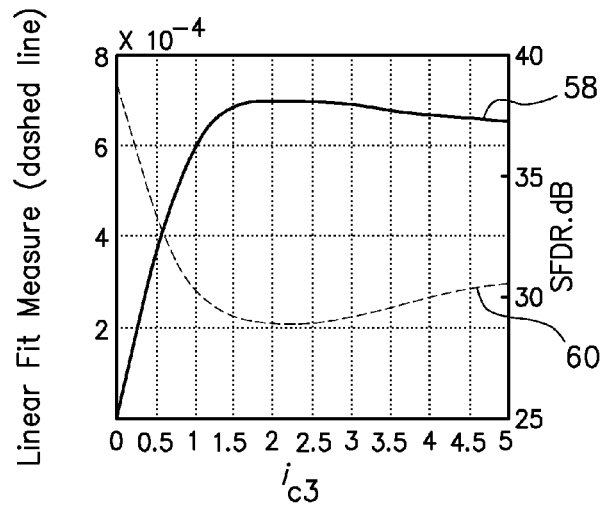
FIG. 10 is a graphical representation of the SFDR voltage response of the SQIF of FIG. 7 as a function of critical current.

Referring now to FIG. 10, the SFDR (line 58) and the linear fitting error (line 60) are plotted as a function of critical current $i_{c3}$ through the third JJ for a SQIF 100 array of N equals 20 bi-SQUID devices 20 as a function of the critical current $i_{c3}$. FIG. 10 can imply that there can exist a critical current where the error decreases significantly such that the linearity increases. FIG. 10 can also shows an optimal value of the critical current where SFDR is optimum and beyond which only marginal improvements in linearity can be achieved. The increase in linearity is similar to what was observed previously in a single bi-SQUID (see FIG. 7), except that now the voltage output does not develop a hysteresis loop so that the linearity does not decrease for larger values of the critical current. Instead, there appears to be a threshold value of the critical current $i_{c3}$ beyond which the linearity remains unchanged as is shown in FIG. 10.

C. 4 Parallel bi-SQUID Array

Recall that in the special case of serial SQIFs 100, the maximum voltage swing $V_{max}(\Phi)$ and transfer factor $\partial V/\partial\Phi$ can increase in direct proportion to the number of loops N in the array, while the thermal noise voltage $V_F$ can be proportional to the square root of N. These relations imply that the dynamic range can increase as $N^{1/2}$. However, for parallel arrays the situation can be different. For parallel arrays, $V_{max}(\Phi)$ remains constant while the transfer factor $\partial V/\partial\Phi$ still increases proportional to N. Thermal noise voltage $V_F$ scales as $N^{-1/2}$. Therefore, the dynamic range is given by $V_{max}(\Phi)/V_F=N^{1/2}$. This configuration can be advantageous in some applications.

Figure 11:
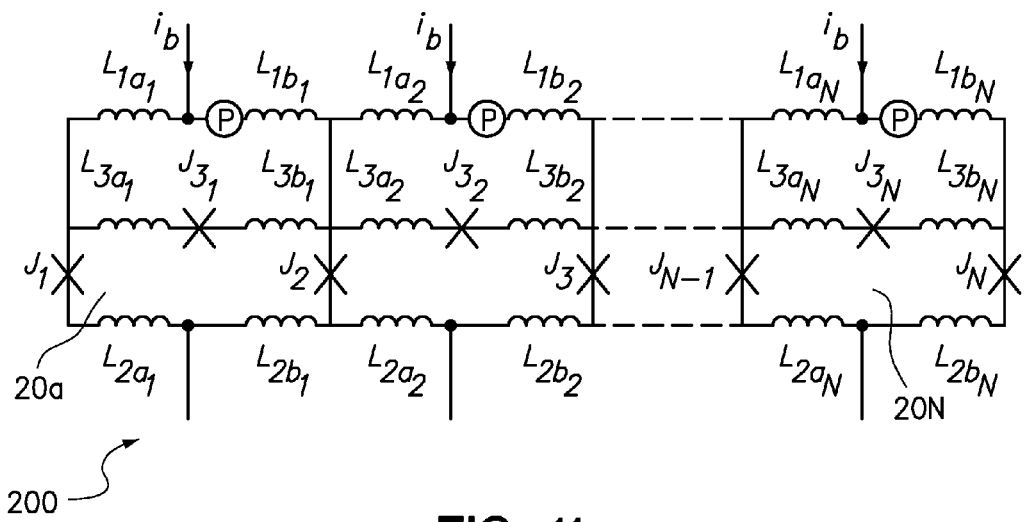
FIG. 11 is a graphical representation of the parallel SQIF of the present invention according to several alternative embodiments.

Referring now to FIG. 11, a parallel SQIF 200, which includes a one-dimensional array of N bi-SQUIDs 20a-20N connected in parallel is shown schematically. In the parallel SQIF 200, the junctions of bi-SQUIDs can be shared among neighboring loops, so that the indices of the phase differences $\phi_n$ of the "classical" SQUID junctions count the junctions and not the loops. This is in direct contrast to the phase differences $\phi_{3,n}$ of the third (bi-SQUID specific) junctions and to the serial SQIF 100, where the junctions from one loop to the next are different. As in the case of serial SQIFs 100, the derivation of the modeling equations for parallel SQIFs 200 can carried out based on conservation of current across the loops. Equation (9) is the result.

Equation (9)

for $n = 1$:

$$B_1 \dot{\varphi}_1 - \left(\frac{L_{2b,1}}{2A_1}\right)\dot{\varphi}_2 - \dot{\varphi}_{3,1} = \left(\frac{1}{A_1}\right)(L_{1b,1}i_b + \varphi_2 - \varphi_1 + 2\pi\varphi_e a_{n,1}) -$$

$$\left(\frac{L_{2a,1}}{A_1} + 1\right)\sin\varphi_1 + \left(\frac{L_{2b,1}}{2A_1}\right)\sin\varphi_2 + i_{c3,1}\sin\varphi_{3,1},$$

$$L_{2a,1}\dot{\varphi}_1 - \frac{L_{2b,1}}{2}\dot{\varphi}_2 + C_1\dot{\varphi}_{3,1} =$$

$$\varphi_2 - \varphi_1 - \varphi_{3,1} - L_{2a,1}\sin\varphi_1 + \frac{L_{2b,1}}{2}\sin\varphi_2 - C_1 i_{c3,1}\sin\varphi_{3,1},$$

for $n = 2 \ldots N$:

$$\left(\frac{L_{2a,n-1}}{2A_{n-1}}\right)\dot{\varphi}_{n-1} - \frac{B_n}{2}\dot{\varphi}_n$$

$$\left(\frac{L_{2b,n}}{2A_n}\right)\dot{\varphi}_{n+1} + \dot{\varphi}_{3,n} - \dot{\varphi}_{3,n-1} =$$

$$\left(\left(\frac{L_{1b,n-1}}{A_{n-1}}\right) - \left(\frac{L_{1b,n}}{A_n}\right) - 1\right)i_b - \left(\frac{1}{A_n}\right)(\varphi_{n+1} - \varphi_n + 2\pi\varphi_e a_{n,n}) +$$

$$\left(\frac{1}{A_{n-1}}\right)(\varphi_n - \varphi_{n-1} + 2\pi\varphi_e a_{n,n-1}) - \left(\frac{L_{2a,n-1}}{2A_{n-1}}\right)\sin\varphi_{n-1} +$$

$$\frac{B_n}{2}\sin\varphi_n - \left(\frac{L_{2b,n}}{2A_n}\right)\sin\varphi_{n+1} - i_{c3,n}\sin\varphi_{3,n} + i_{c3,n-1}\sin\varphi_{3,n-1},$$

$$\frac{L_{2a,n}}{2}\dot{\varphi}_n - \frac{L_{2b}}{2}\dot{\varphi}_{n+1} + C_n\dot{\varphi}_{3,n} =$$

$$\varphi_{n+1} - \varphi_n - \varphi_{3,n} - \frac{L_{2a,n}}{2}\sin\varphi_n + \frac{L_{2b}}{2}\sin\varphi_{n+1} - C_n i_{c3,n}\sin\varphi_{3,n},$$

for $n = N + 1$:

$$\left(\frac{L_{2a,N}}{2A_N}\right)\dot{\varphi}_N - B_{N+1}\dot{\varphi}_{N+1} - \dot{\varphi}_{3,N} =$$

$$\left(\frac{1}{A_N}\right)(-L_{1b,N}i_b + \varphi_{N+1} - \varphi_N + 2\pi\varphi_e a_{n,N}) -$$

$$\left(\frac{L_{2a,N}}{2A_N}\right)\sin\varphi_N + \left(1 + \frac{L_{2b,N}}{A_N}\right)\sin\varphi_{N+1} + i_{c3,N}\sin\varphi_{3,N},$$

where $A_n = L_{1a,n} + L_{1b,n}$ for $n = 1 \ldots N$, $$B_1 = \left(\frac{L_{2a,1}}{A_1} + 1\right), B_n = \left(\frac{L_{2a,n}}{A_n} + \frac{L_{2b,n-1}}{A_{n-1}} + 2\right)$$

for $n = 2, \ldots, N$, $$B_{N+1} = \left(1 + \frac{L_{2b,N}}{A_N}\right),$$

$C_n = (L_{3a,1} + L_{3b,1})$ for $n = 1 \ldots N$, and $\phi_n$ is the phase difference for the $n^{th}$ junction ($J_n$), $i_b$ is the normalized bias current, $i_{c3,n}$ is the normalized critical current for the third junction of the $n^{th}$ loop and it is assumed to be identical for each loop. Additionally, inductances can be given by $L_n = [L_{1a,n}, L_{1b,n},$ $L_{2a,n}, L_{2b,n}, L_{3a,n}, L_{3b,n}]$ for $n = 1, \ldots, N$. Like the case for the serial SQIF embodiment 100 described above, the inductances to $L_n = a_{n,n} L_1$, where $a_{n,n}$ corresponds to the $n^{th}$ bi-SQUID loop dynamics can be assumed to be uniform. However, equation (9) can also handle instances the where inductances $L_n$ in bi-SQUID JJs 12 are not uniform.

Figure 12:
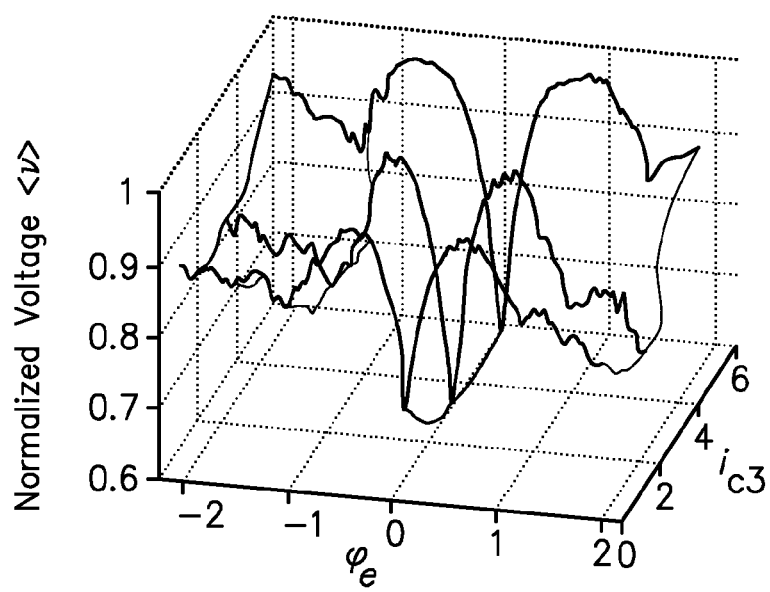
FIG. 12 is a graphical representation of the voltage response of the SQIF of FIG. 11 as a function of magnetic field strength and critical current.

Computer simulations of Eq. (9) were performed to calculate the voltage response of the parallel array of bi-SQUIDs as function of the external field and the critical current $i_{c3}$. FIG. 12 shows a representative example of these simulations for an parallel SQIF 200 array of N=20 bi-SQUID loops. In FIG. 9, numerical simulations of the voltage response of a non-uniform parallel bi-SQUID array 200 as a function of the critical current $i_{c3}$ and external flux $\phi_e$ is shown. Loop sizes can be selected according to a Gaussian distribution (although other distributions are certainly possible). All other parameter values are the same as those used to generate FIG. 9 for serial SQIF 100. As can be inferred from FIG. 12, the parallel SQIF 200 array of bi-SQUIDs can also produce an anti-peak voltage response centered around zero flux (magnetic field strength is zero).

Figure 13:
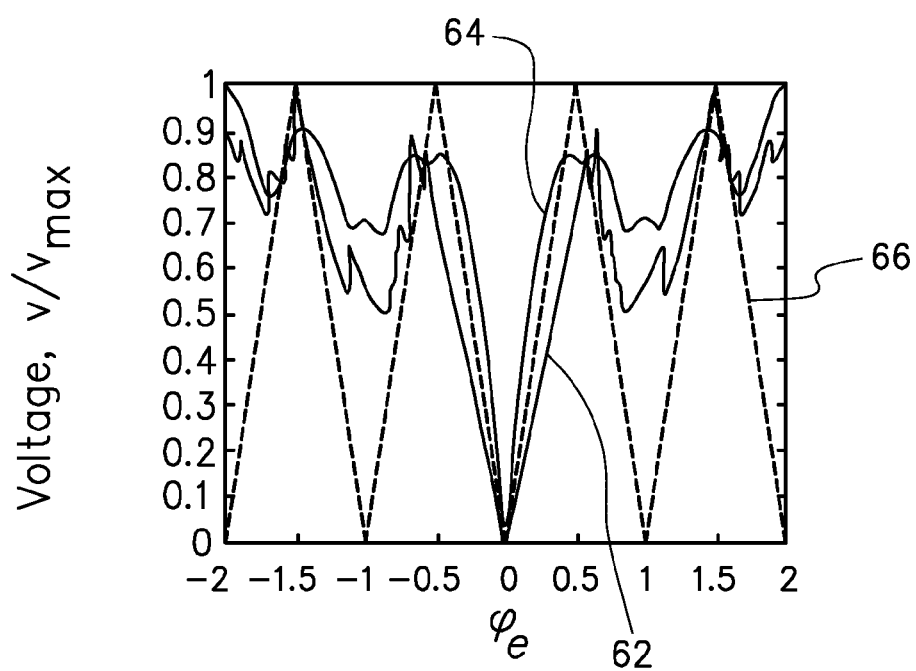
FIG. 13 is a graphical comparison of the voltage response of the series SQIF of FIG. 7 with the parallel SQIF of FIG. 11*f* of the SQIF of FIG. 7 as a function of magnetic field strength.

FIG. 13 is a graph that compares the voltage response of the serial SQIF 100 and parallel SQIF as a function of critical current. Each voltage output was computed at the optimal value of the critical current $i_{c3}$ where the individual arrays produce the highest linearity. For reference purposes, the normalized voltage output of a single bi-SQUID, as indicated by dotted line 66 in FIG. 13 is also included. The most important visual differences are the high linearity and broad width of the voltage anti-peak of the serial array (line 62) compared to that of the parallel array (line 64). This observation is supported by the linearity test performed through the least-squares method, as is described above, which shows the series array producing a smaller error. From comparing the voltage response of a single bi-SQUID 66 to the voltage responses 62 and 64 for serial SQIF 100 and parallel SQIF 200 respectively, it can be seen that the voltage output of the single bi-SQUID also exhibits high linearity but it lacks the anti-peak feature that makes the arrays ideal detectors of absolute strength of magnetic fields. It is then reasonable to conclude that the serial array offers the best performance of a multi-loop array of JJs in terms of higher linearity over a wide dynamic range. For application in an open environment, FIG. 13 can imply that serial SQIF arrays 100 are indeed a good choice; however, parallel SQIFs 200 may be more advantageous in situations where greater control of SQIF impedance is desired. Note also that the phase equations of a series array are invariant under the change $\phi_e \mapsto -\phi_e$, which manifests as a reflectional symmetry of the voltage response curves shown in FIG. 9. These symmetries are not present in the phase equations of the parallel array. Further analysis may be required to determine if there is a direct correlation between symmetry and linearity for a parallel SQIF 200.

D. Circuit Design, Fabrication, and Experimental Evaluation

In order to verify analytical and computational results described in the previous section, serial SQIFs 100 and parallel SQIFs 200 of arrays bi-SQUIDs were manufactured using a thin-film fabrication process by HYPRES®. The parameter values that were selected through the optimazition algorithms embodiment in equations (7) for series SQIFs 100 and equation (9) for parallel SQIFs 200. The resulting parameter values were: $\beta$:1, critical currents $I_{c1} = I_{c2} = 250$ µA, shunting resistances $R_{sh} = 2.2$ Ω, $V_c = I_{c2} R_{sh} = 550$ µV, the critical current of the third unshunted junction $I_{c3} = 250$ µA.

Figure 14:
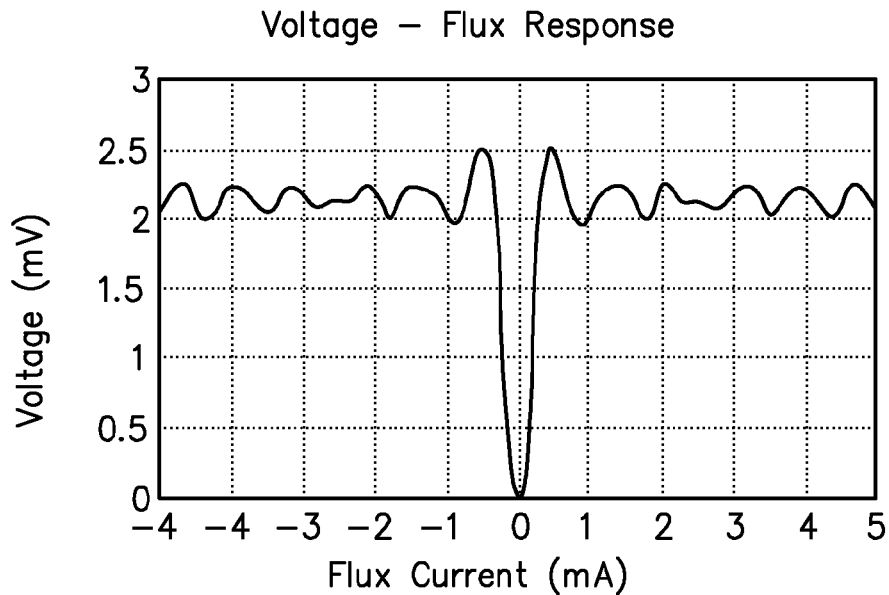
FIG. 14 is a graph of voltage versus flux current for the series SQIF of FIG. 7.
Figure 15:
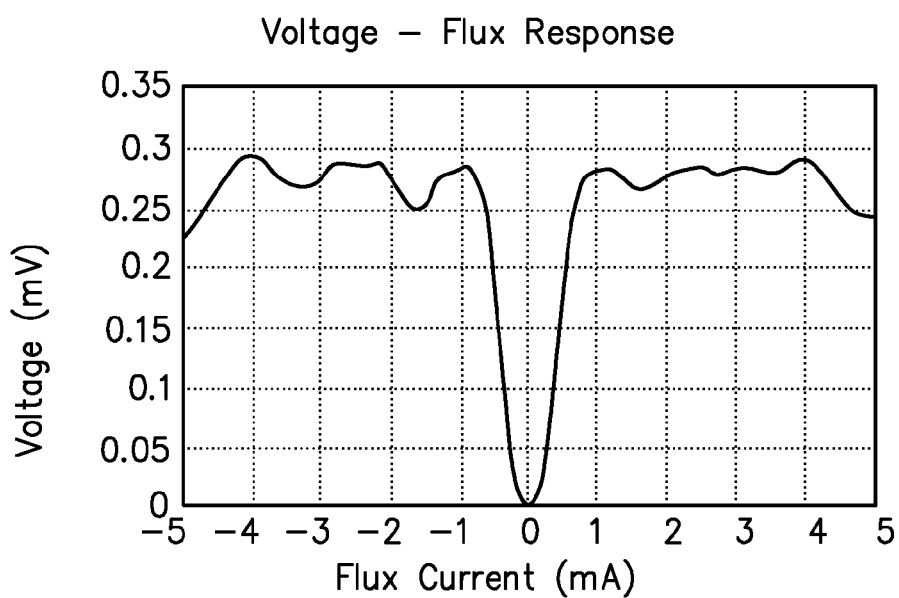
FIG. 15 is a graph of voltage versus flux current for the parallel SQIF of FIG. 11; and, FIG. 16 is a block diagram of steps that can be take to accomplish the methods accordingly to several embodiments.

FIG. 14 illustrates the results of circuits simulation of two multi-loop arrays with N=10 bi-SQUIDs per array and normal distribution of bi-SQUID inductances for a serial SQIF 100. FIG. 15 illustrates the results for a parallel SQIF 200 where the bi-SQUIDs 20 are connected in parallel. By cross-referencing FIGS. 14 and 15, it can be seen that the voltage response of both arrays exhibit an anti-peak profile centered at zero magnetic flux. There are, however, subtle differences between the two responses that are worth discussing in terms of typical measurements, such as voltage peak height, full width at maximum peak and transfer function. Observe, for instance, that the voltage peak height around zero flux $V_p$ is significantly higher, approximately three times, in the serial SQIF 100 (FIG. 14) than for the parallel SQIF 200 (FIG. 15). A similar difference in the peak height is observed in circuit simulations with larger arrays. Observe also that the full width at half maximum of the peak $\phi_{e,hw}$ is also larger in the parallel SQIF array 200. It has been found that in arrays with large inductances the voltage modulation and the transfer function were not very sensitive to the junctions asymmetry. As predicted by theory, the voltage output of the serial array is symmetric with respect to a vertical line through zero flux. As we mentioned earlier this feature is a direct consequence of the reflectional symmetry $\phi_e \mapsto -\phi_e$ in the corresponding model equations.

Figure 16:
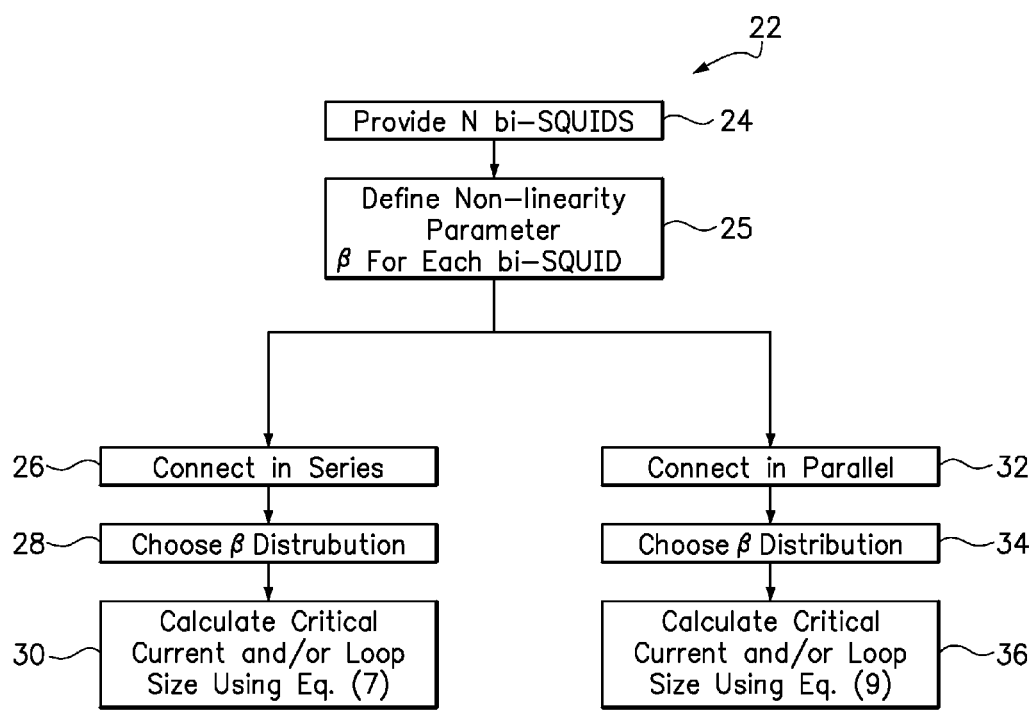

Referring now to FIG. 16, block diagram 22 illustrates the methods of the present invention according to several embodiments. As shown, FIG. 16 the methods can include the initial step of provided a plurality of N array cells, as indicated by block 24 in FIG. 16. Each array cell can have the bi-SQUID structure cited above, and a non-linearity $\beta_i$ for each bi-SQUID can also be defined (block 25) as described above. As shown by block 26, the bi-SQUID's can be connected in series. If the bi-SQUIDs are connected in series, mutual inductances are established by adjacent bi-SQUIDs as described above. As depicted by block 28, a distribution pattern for critical current $i_{ci}$ or loop size $L_i$ is chosen for the bi-SQUIDs. Next, and as indicted by block 30, for each bi-SQUID, the critical current and/or loop size is calculated according to Equation (7) above, to yield a SQIF with a uniform, linear response over a wide dynamic range.

If the bi-SQUIDs are connected in parallel (block 32), in several embodiments of the present invention. For these embodiments, and as depicted by block 34, a distribution pattern for critical current $i_{ci}$ or loop size $L_i$ is chosen for the bi-SQUIDs. Some distributions that could be used can include Gaussian, linear, exponential and logarithm distributions. Next, and as indicted by block 36, for each bi-SQUID, the critical current and/or loop size is calculated according to Equation (9) above, to yield a SQIF with a uniform, linear response over a wide dynamic range.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for improving linearity over a wide dynamic range for an amplifier, comprising the steps of:
   A) providing a plurality of N individual array cells;
   each said array cell having 3 Josephson Junctions to establish a bi-Superconductive Quantum Interference Device (SQUID) for said array cell, each said Josephson Junction having a critical current $i_c$, and loop inductance $L_i$; each said bi-SQUIDs further having a non-uniform bi-SQUID parameter $\beta_i$, described by $\beta_i = 2\pi L_i i_{ci}/\Phi_0$, from i=1 to N, where $L_i$ is said loop inductance, $i_{ci}$ is said critical current, and $\Phi_0$ is a flux quantum for each said bi-SQUID;
   B) connecting said array cells in series to establish a Superconducting Quantum Interference Filter (SQIF) array of N said bi-SQUIDs;
   wherein said step B) establishes mutual inductances between said array cells, and wherein said non-linearity parameter $\beta_i$ is manipulated by changing said critical current $i_{ci}$ for each said bi-SQUID according to a predetermined Gaussian distribution pattern; and,
   wherein said critical current is determined according to the relationship $$(L_{1,i}+L_{2a,i})\dot{\phi}_{i,1}-L_{2b,i}\dot{\phi}_{i,2}-L_{1,i}\dot{\phi}_{i,3}=L_{1b,i}i_b+\phi_{i,2}-\phi_{i,1}+ 2\pi\phi_e a_{n,i}+M\Phi_i+L_{1,i}i_{c3,i}\sin\phi_{i,3}+L_{2b,i}\sin\phi_{i,2}-(L_{1,i}+L_{2a,i})\sin\phi_{i,1}$$

$$L_{2a,i}\dot{\phi}_{i,1}-(L_{1,i}+L_{2b,i})\dot{\phi}_{i,2}-L_{1,i}\dot{\phi}_{i,3}=-L_{1a,i}i_b+\phi_{i,2}-\phi{i,1}+ 2\pi\phi_e a_{n,i}+M\Phi_i+L_{1,i}i_{c3,i}\sin\phi_{i,3}-L_{2a,i}\sin\phi_{i,1}$$

$$L_{2a,i}\dot{\phi}_{i,1}-L_{2b,i}\dot{\phi}_{i,2}-(L_{3a,i}+L_{3b,i})\dot{\phi}_{i,3}=\phi_{i,2}-\phi_{i,3}+\phi_{i,1}+ M\Phi_i-(L_{3a,i}+L_{3b,i})i_{c3,i}\sin\phi_{i,3}-L_{2a,i}\sin\phi_{i,1}+L_{2b,i}\sin\phi_{i,2},$$

where $\phi_{i,j}$ are the phases on each said Josephson Junctions $J_{i,j}$, i=1 to N, j=1 to 3, $L_{1,i}=(L_{1a,i}+L_{1b,i})$, $a_{n,i}$ is a parameter related to the loop size between $J_{i,1}$ and $J_{i,2}$, and M is the coupling strength for the phase interaction $\Phi_i$ between adjacent said bi-SQUIDS (one adjacent said bi-SQUID for edge said bi-SQUIDS a=1 and N, and two neighboring said bi-SQUIDs for inner said bi-SQUIDS a=2 through N−1) according to $$\Phi_i = \begin{cases} \frac{1}{a_{n,2}}(\varphi_{2,1} - \varphi_{2,2} - 2\pi\varphi_e a_{n,2}), & \text{for } i = 1 \\ \frac{1}{a_{n,i+1}}(\varphi_{i+1,1} - \varphi_{i+1,2} - 2\pi\varphi_e a_{n,i+1}) + \\ \frac{1}{a_{n,i-1}}(\varphi_{i-1,1} - \varphi_{i-1,2} - 2\pi\varphi_e a_{n,i-1}), & \text{for } i = 2, \ldots, N-1 \\ \frac{1}{a_{n,N-1}}(\varphi_{N-1,1} - \varphi_{N-1,2} - 2\pi\varphi_e a_{n,N-1}), & \text{for } i = N \end{cases}$$

where $i_b$ is a bias current and $i_{c3} = I_{c3}/I_c$ is a normalized said critical current of a third said Josephson Junction $J_3$ in each said bi-SQUID.

2. The method of claim 1 wherein said step B) is accomplished by connecting said array cells in parallel.

3. The method of claim 1 wherein said step B) establishes mutual inductances between said array cells, and said non-linearity parameter $\beta_i$ is manipulated by changing said loop size $L_i$ for said array cell, to yield a linear response for said SQIF.

4. The method of claim 2 wherein said step B) establishes mutual inductances between said array cells, and said non-linearity parameter $\beta_i$ is manipulated by changing said critical current $I_{ci}$ for said array cell, to yield a linear response for said SQIF.

5. The method of claim 2 wherein said step B) establishes mutual inductances between said array cells, and said non-linearity parameter $\beta_i$ is manipulated by changing said loop size $L_i$ for said array cell, to yield a linear response for said SQIF.

6. An amplifier comprising:
a Superconductive Quantum Interference Filter (SQIF);
said SQIF including at least two bi-Superconductive Quantum Interference Devices (SQUIDs) that are connected to each other;
each said bi-SQUIDs having a non-uniform bi-SQUID parameter $\beta_i$, described by $\beta_i = 2\pi L_i i_{ci}/\Phi_0$, from i=1 to N, where $L_i$ is a loop inductance $i_{ci}$ is a critical current; and $\Phi_0$ is a flux quantum for said bi-SQUID and N is a number of said bi-SQUIDs in said SQIF;
wherein said bi-SQUIDS are connected in series, and further wherein said critical current $i_{ci}$ of said non-uniform parameter $\beta_i$ is varied; and
wherein said critical current for each said bi-SQUID for a said SQIF of N said bi-SQUIDs is determined according to the relationship $$(L_{1,i} + L_{2a,i})\dot{\phi}_{i,1} - L_{2b,i}\dot{\phi}_{i,2} - L_{1,i}\dot{\phi}_{i,3} = L_{1b,i}i_b + \phi_{i,2} - \phi_{i,1} + 2\pi\phi_e a_{n,i} + M\Phi_i + L_{1,i}i_{c3,i}\sin\phi_{i,3} + L_{2b,i}\sin\phi_{i,2} - (L_{1,i} + L_{2a,i})\sin\phi_{i,1}$$

$$L_{2a,i}\dot{\phi}_{i,1} - (L_{1,i} + L_{2b,i})\dot{\phi}_{i,2} - L_{1,i}\dot{\phi}_{i,3} = -L_{1a,i}i_b + \phi_{i,2} - \phi{i,1} + 2\pi\phi_e a_{n,i} + M\Phi_i + L_{1,i}i_{c3,i}\sin\phi_{i,3} - L_{2a,i}\sin\phi_{i,1}$$

$$L_{2a,i}\dot{\phi}_{i,1} - L_{2b,i}\dot{\phi}_{i,2} - (L_{3a,i} + L_{3b,i})\dot{\phi}_{i,3} = \phi_{i,2} - \phi_{i,3} + \phi_{i,1} + M\Phi_i - (L_{3a,i} + L_{3b,i})i_{c3,i}\sin\phi_{i,3} - L_{2a,i}\sin\phi_{i,1} + L_{2b,i}\sin\phi_{i,2},$$

where $\phi_{i,j}$ are the phases on each said Josephson Junctions $J_{ij}$, i=1 to N, j=1 to 3, $L_{1,i} = (L_{1a,i} + L_{1b,i})$, $a_{n,i}$ is a parameter related to the loop size between $J_{i,1}$ and $J_{i,2}$, and M is a coupling strength for a phase interaction $\Phi_i$ between adjacent said bi-SQUIDS (one adjacent said bi-SQUID for edge said bi-SQUIDS a=1 and N, and two neighboring said bi-SQUIDs for inner said bi-SQUIDS a=2 through N−1) according to:

$$\Phi_i = \begin{cases} \frac{1}{a_{n,2}}(\varphi_{2,1} - \varphi_{2,2} - 2\pi\varphi_e a_{n,2}), & \text{for } i = 1 \\ \frac{1}{a_{n,i+1}}(\varphi_{i+1,1} - \varphi_{i+1,2} - 2\pi\varphi_e a_{n,i+1}) + \\ \frac{1}{a_{n,i-1}}(\varphi_{i-1,1} - \varphi_{i-1,2} - 2\pi\varphi_e a_{n,i-1}), & \text{for } i = 2, \ldots, N-1 \\ \frac{1}{a_{n,N-1}}(\varphi_{N-1,1} - \varphi_{N-1,2} - 2\pi\varphi_e a_{n,N-1}), & \text{for } i = N \end{cases}$$

where $i_b$ is a bias current, $i_{c3} = I_{c3}/I_c$ is a normalized critical current of a third said Josephson Junction $J_3$ in each said bi-SQUID.

7. The amplifier of claim 6, wherein said bi-SQUIDS are connected in series, and further wherein said critical current $i_{ci}$ of said non-uniform parameter $\beta_i$ is varied according to a predetermined distribution pattern.

8. The amplifier of claim 7, wherein said distribution pattern is selected from the group consisting of linear, Gaussian exponential and logarithmic.

9. A system comprising:
a plurality of N bi-Superconductive Quantum Interference Devices (SQUIDs);
each of said plurality of N bi-SQUIDs having 3 Josephson Junctions, each said Josephson Junction having a critical current $i_c$, and a loop inductance $L_i$;
each said bi-SQUIDs further having a non-uniform bi-SQUID parameter $\beta_i$, described by $\beta_i = 2\pi L_i i_{ci}/\Phi_0$, from i=1 to N, where $L_i$ is said loop inductance, $i_{ci}$ is said critical current, and $\Phi_0$ is a flux quantum for each said bi-SQUID; and,
a processor, said processor incorporating non-transitory written instructions, that, when accomplished by said processor, accomplish the following linearization methods when said bi-SQUIDs are connected to each other to establish a Superconducting Quantum Interference Filter (SQIF) array;
receiving an input distribution pattern of said non-uniform bi-SQUID parameters $\beta_i$;
calculating each said critical current for each said Josephson Junction to maximize a linear response for said SQIF array according to the results of said distribution pattern.

10. The system of claim 9 wherein said bi-SQUIDs are connected in series and said calculating step is accomplished according to the following relationship $$(L_{1,i} + L_{2a,i})\dot{\phi}_{i,1} - L_{2b,i}\dot{\phi}_{i,2} - L_{1,i}\dot{\phi}_{i,3} = L_{1b,i}i_b + \phi_{i,2} - \phi_{i,1} + 2\pi\phi_e a_{n,i} + M\Phi_i + L_{1,i}i_{c3,i}\sin\phi_{i,3} + L_{2b,i}\sin\phi_{i,2} - (L_{1,i} + L_{2a,i})\sin\phi_{i,1}$$

$$L_{2a,i}\dot{\phi}_{i,1} - (L_{1,i} + L_{2b,i})\dot{\phi}_{i,2} - L_{1,i}\dot{\phi}_{i,3} = -L_{1a,i}i_b + \phi_{i,2} - \phi{i,1} + 2\pi\phi_e a_{n,i} + M\Phi_i + L_{1,i}i_{c3,i}\sin\phi_{i,3} - L_{2a,i}\sin\phi_{i,1}$$

$$L_{2a,i}\dot{\phi}_{i,1} - L_{2b,i}\dot{\phi}_{i,2} - (L_{3a,i} + L_{3b,i})\dot{\phi}_{i,3} = \phi_{i,2} - \phi_{i,3} + \phi_{i,1} + M\Phi_i - (L_{3a,i} + L_{3b,i})i_{c3,i}\sin\phi_{i,3} - L_{2a,i}\sin\phi_{i,1} + L_{2b,i}\sin\phi_{i,2},$$

where $\phi_{i,j}$ are the phases on each said Josephson Junctions $J_{ij}$, i=1 to N, j=1 to 3, $L_{1,i} = (L_{1a,i} + L_{1b,i})$, $a_{n,i}$ is a parameter related to the loop size between $J_{i,1}$ and $J_{i,2}$, and M is a coupling strength for a phase interaction $\Phi_i$ between adjacent said bi-SQUIDS (one adjacent said bi-SQUID for edge said bi-SQUIDS a=1 and N, and two neighboring said bi-SQUIDs for inner said bi-SQUIDS a=2 through N−1) according to:

$$\Phi_i = \begin{cases} \frac{1}{a_{n,2}}(\varphi_{2,1} - \varphi_{2,2} - 2\pi\varphi_e a_{n,2}), & \text{for } i = 1 \\ \frac{1}{a_{n,i+1}}(\varphi_{i+1,1} - \varphi_{i+1,2} - 2\pi\varphi_e a_{n,i+1}) + \\ \frac{1}{a_{n,i-1}}(\varphi_{i-1,1} - \varphi_{i-1,2} - 2\pi\varphi_e a_{n,i-1}), & \text{for } i = 2, \ldots, N-1 \\ \frac{1}{a_{n,N-1}}(\varphi_{N-1,1} - \varphi_{N-1,2} - 2\pi\varphi_e a_{n,N-1}), & \text{for } i = N \end{cases}$$

where $i_b$ is a bias current, $i_{c3} = I_{c3}/I_c$ is a normalized critical current of a third said Josephson Junction $J_3$ in each said bi-SQUID.

\* \* \* \* \*